United States Patent
Vashishtha et al.

(10) Patent No.: US 9,397,622 B2
(45) Date of Patent: Jul. 19, 2016

(54) PROGRAMMABLE HYSTERESIS COMPARATOR

(71) Applicant: STMicroelectronics Pvt. Ltd., Greater Noida (IN)

(72) Inventors: Sameer Vashishtha, Greater Noida (IN); Saiyid Mohammad Irshad Rizvi, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/530,055

(22) Filed: Oct. 31, 2014

(65) Prior Publication Data

US 2016/0126909 A1      May 5, 2016

(51) Int. Cl.
*H03F 3/45*       (2006.01)
*H03K 5/24*       (2006.01)

(52) U.S. Cl.
CPC .......... *H03F 3/45179* (2013.01); *H03K 5/2481* (2013.01); *H03F 2200/129* (2013.01); *H03F 2203/45112* (2013.01); *H03F 2203/45116* (2013.01)

(58) Field of Classification Search
CPC .......... H03F 3/45179; H03F 2200/129; H03F 2203/45116; H03F 2203/45112; H03K 5/2481; H03K 5/2472
See application file for complete search history.

(56) References Cited

U.S. PATENT DOCUMENTS 8,030,999 B2 * 10/2011 Chatterjee ........... H03F 3/45071
                                                         330/253
8,289,053 B2 * 10/2012 Ogawa ................. G09G 3/3688
                                                         327/64
8,704,553 B2 *  4/2014 Pun ..................... H03F 3/45071
                                                         327/55

* cited by examiner

*Primary Examiner* — Jung Kim
(74) *Attorney, Agent, or Firm* — Slater Matsil, LLP

(57) ABSTRACT

In one embodiment, a circuit includes a differential amplifier having a differential pair with a first transistor and second transistor. Each of the first and the second transistors include a front gate contact and a back gate contact. A first digital feedback loop is coupled between an output of the differential amplifier to the back gate contact of the first transistor. A second digital feedback loop is coupled to the back gate contact of the second transistor. The first digital feedback loop is configured to be opposite in phase to the second digital feedback loop.

32 Claims, 10 Drawing Sheets

PROGRAMMABLE HYSTERESIS COMPARATOR

TECHNICAL FIELD

The present invention relates generally to comparators, and, in particular embodiments, to programmable hysteresis comparators.

BACKGROUND

Generally a comparator is a device that compares two voltages or currents and outputs a digital signal indicating which is larger. In other words, as the name suggests, a comparator compares an analog signal with another analog signal and outputs a binary signal based on the comparison. The comparator can be thought of as a decision-making circuit.

Comparators are generally classified as open-loop comparators and regenerative comparators. Comparators are generally used in open-loop mode and so it is not necessary to compensate the comparator. Open-loop comparators are basically operational amplifiers without compensation. Since no compensation is needed, it has the largest bandwidth possible which gives a faster response. Since comparators are generally used in open loop mode, they can have very high open-loop gain. Regenerative comparators use positive feedback, similar to sense amplifiers or flip-flops, to accomplish the comparison of the magnitude between two signals.

The comparator is widely used in the process of converting analog signals to digital signals, for example, in analog-digital converters, zero crossing detectors, null detectors, relaxation oscillators, level shifters, window detectors, and others.

While it is easy to understand the basic task of a comparator, that is, comparing two voltages or currents, several parameters must be considered while selecting a suitable comparator. For example, comparators generally are designed to operate more optimally than op-amps in digital applications, in that comparator output voltages will go very close to the power supply voltage rails and their outputs will swing between these rails very fast, that is they have a very high slew rate. Other parameters that are important for comparators include gain, propagation delay, input offset, and others.

One problem with comparators is that the input signal is often corrupted with noise and/or may be very slowly changing. A comparator normally changes its output state when the voltage between its inputs crosses through approximately zero volts, for example, when using the comparator as a zero-crossing detector. Small voltage fluctuations due to noise that are always present on the inputs can cause undesirable rapid changes between the two output states when the input voltage difference is near zero volts. This noise can cause output glitches that consume a lot of power.

To prevent this output oscillation, a small hysteresis of a few millivolts is integrated into many modern comparators. In place of one switching point, hysteresis introduces two switching points.

When the input voltage drops to a lower reference voltage (a negative trip point), the output voltage changes from the high level state to a low level state. The comparator output voltage will remain in the low level state as the input voltage increases. When the input voltage reaches an upper reference voltage (a positive trip point), the output voltage will change from the low level state to the high level state. The difference between the positive trip point (VTRIP+) and the negative trip point (VTRIP−) equals the hysteresis voltage (VHYST). Such a bi-stable circuit is in effect a comparator with hysteresis. Such hysteresis may be introduced internally or using an external circuit.

SUMMARY

In accordance with an embodiment of the present invention, a circuit includes a differential amplifier having a differential pair with a first transistor and second transistor. Each of the first and the second transistors include a front gate contact and a back gate contact. A first digital feedback loop is coupled between an output of the differential amplifier to the back gate contact of the first transistor. A second digital feedback loop is coupled to the back gate contact of the second transistor. The first digital feedback loop is configured to be opposite in phase to the second digital feedback loop.

In an alternative embodiment of the present invention, a circuit comprises a current mirror comprising a first transistor and second transistor. Each of the first and the second transistors comprise a front gate contact and a back gate contact. A first digital feedback loop is coupled to the back gate contact of the first transistor. A second digital feedback loop is coupled to the back gate contact of the second transistor. The first digital feedback loop is configured to be opposite in phase to the second digital feedback loop.

In a further alternative embodiment of the present invention, a comparator comprises a differential amplifier including a differential transistor pair, which comprises a first transistor and a second transistor. Each of the first and the second transistors comprise a four terminal silicon on insulator transistor including a back gate contact. A first inverter is coupled to an output of the differential amplifier. A first feedback loop is coupled between an output of the first inverter and the back gate contact of the first transistor. A second inverter is coupled to the output of the first inverter. A second feedback loop is coupled between the output of the second inverter and the back gate contact of the second transistor.

In yet alternative embodiment of the present invention, a comparator includes a differential amplifier including a current mirror comprising a first transistor and a second transistor. Each of the first and the second transistors comprise a four terminal silicon on insulator transistor having a back gate contact. A first inverter is coupled to an output of the differential amplifier. A first feedback loop is coupled between an output of the first inverter and the back gate contact of the first transistor. A second inverter is coupled to the output of the first inverter. A second feedback loop is coupled between an output of the second inverter and the back gate contact of the second transistor.

In yet alternative embodiment of the present invention, a method of operating a circuit includes providing a differential transistor pair comprising a first transistor and a second transistor. The first and the second transistors comprise a four terminal comprising a front gate contact and a back gate contact. The method further includes applying a first feedback signal on the back gate contact of the first transistor and a second feedback signal on the back gate contact of the second transistor. The first feedback signal is opposite in phase to the second feedback signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

As is well known, comparator devices are widely used in a multiplicity of electronic control and actuation circuits to determine the moment that a signal having any waveform reaches a given reference level. As described above, when the input signal slowly changes, an output oscillation may appear while the input signal is close to the reference signal. Similarly, low amplitude signal on a high impedance can cause oscillations due to background noise. Such behavior is solved by designing a comparator with a hysteresis. The principle of hysteresis uses different input threshold voltages depending on actual output state. Typically hysteresis is about a few hundred mV.

Embodiments of the present invention describe a circuit and method to program the hysteresis of comparators. After describing the conventional operation of a comparator, embodiments of the present invention will be described using FIGS. 3-10.

Figure 1:
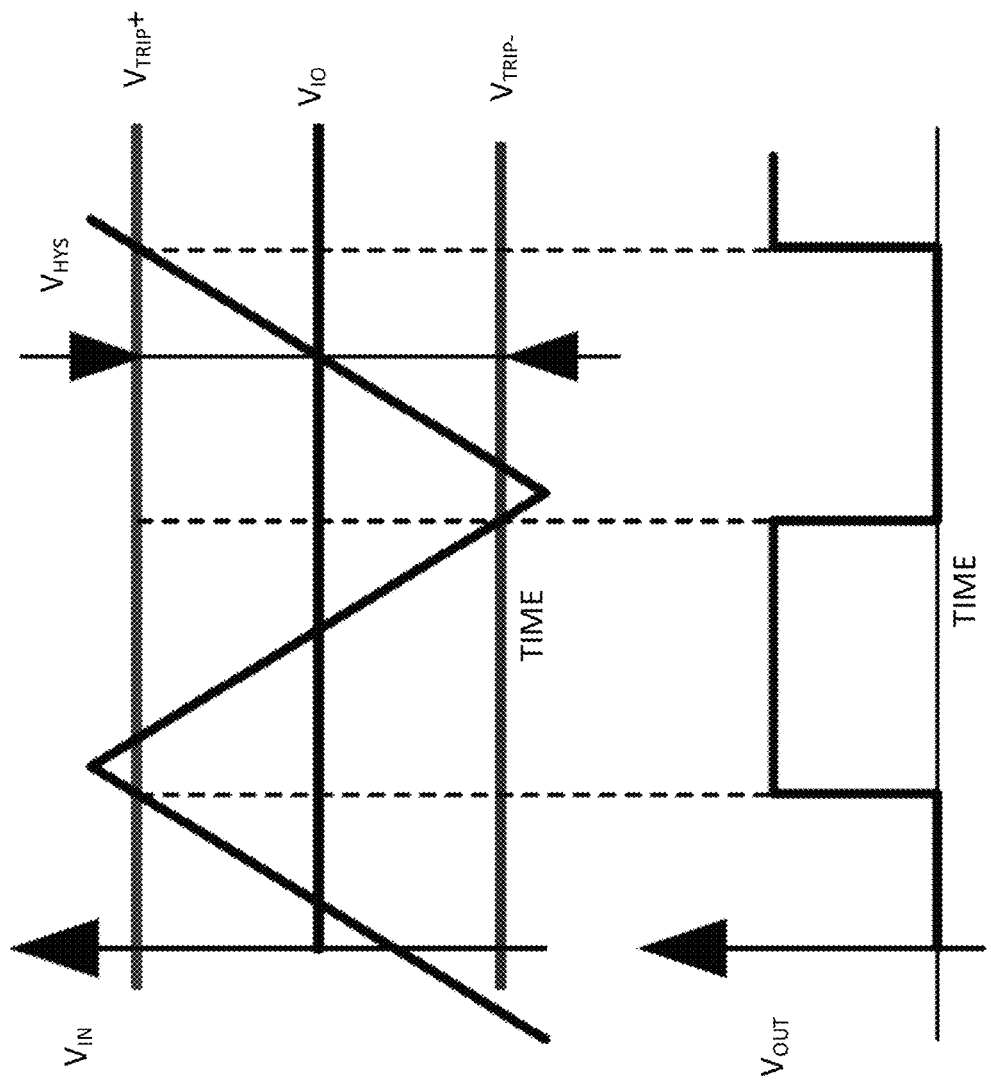
FIG. 1 illustrates a schematic voltage outputted by a conventional comparator exhibiting hysteresis.

FIG. 1 illustrates a schematic voltage outputted by a comparator exhibiting hysteresis.

Referring to FIG. 1, the input voltage (top schematic in FIG. 1) is shown as the triangular pulse voltage. The comparator has an average voltage $V_{IO}$, a lower trip voltage $V_{TRIP-}$, and an upper trip voltage $V_{TRIP+}$. The difference between the lower and the upper trip voltages $V_{TRIP-}$ and $V_{TRIP+}$ is the hysteresis voltage $V_{HYS}$. The lower schematic of FIG. 1 illustrates the corresponding output voltage $V_{OUT}$.

To improve noise sensitivity, the hysteresis may be adjusted. However, changing the hysteresis requires a redesign of the circuit. For example, the ratio of size of MOS transistors of the comparators has to be changed. As an illustration, the transistor width or gate length may be made to be different. Such a redesign requires a complete reconstruction and redesign of the comparator. Thus, on a practical basis, the hysteresis of the comparator is fixed and cannot be changed without an expensive redesign.

Additionally, conventional programmable hysteresis designs rely on generating voltages that are not binary, which increases the product cost especially for digital applications.

Embodiments of the present invention overcome these and other problems by applying a potential across the back gates of a differential transistor pair.

Figure 2:
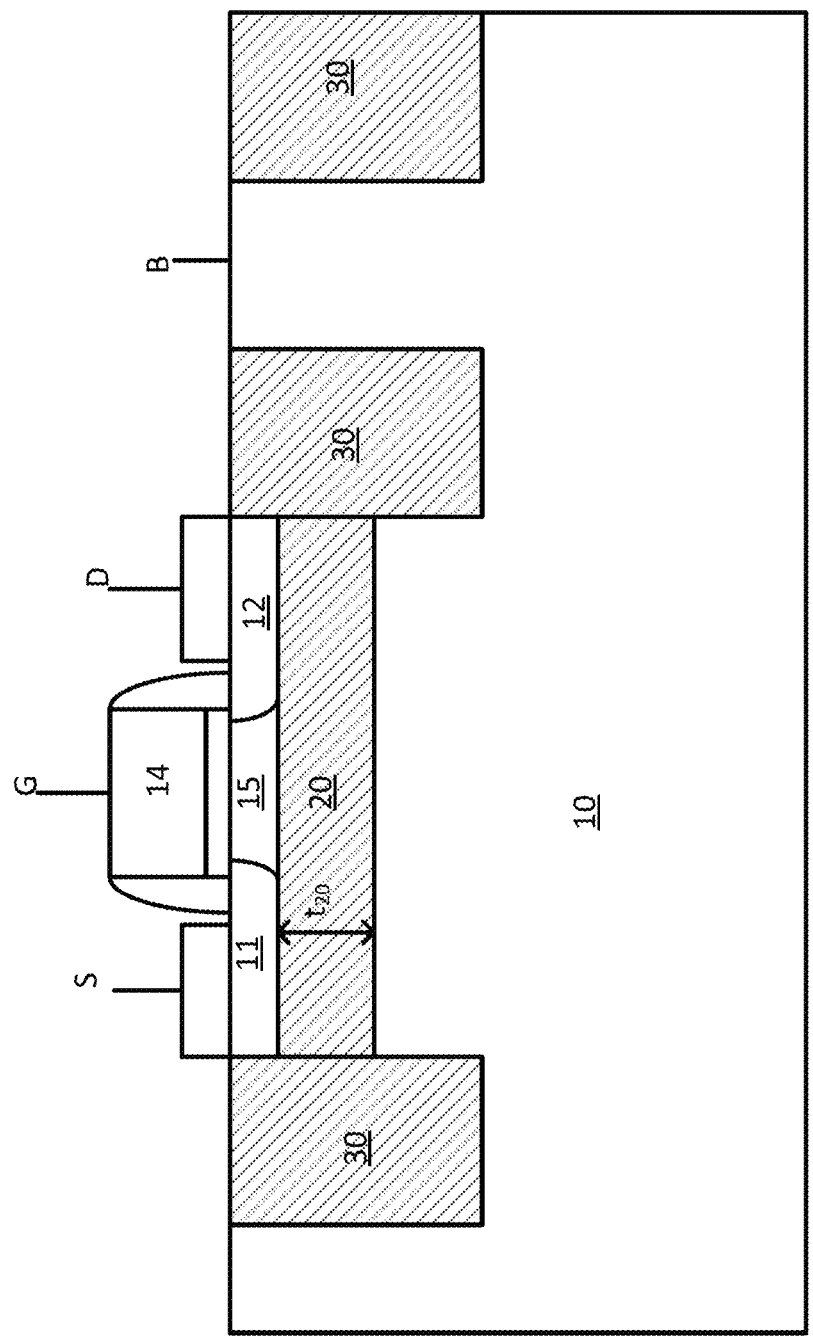
FIG. 2 illustrates a conventional four terminal fully-depleted silicon on insulator (FDSOI) transistor.

FIG. 2 illustrates a four terminal fully-depleted silicon on insulator (FDSOI) transistor used in various embodiments of the present invention. In alternative embodiments, a partially depleted transistor and a fully depleted fin based transistor may be used.

Referring to FIG. 2, the FDSOI transistor includes a source contact S coupled to a source region 11, a drain contact D coupled to a drain region 12, a gate contact coupled to a gate region 14. The channel region 15 is formed under the gate region 14 within the thin silicon layer over the insulator layer 20. The transistors may be isolated using isolation regions 30.

As further illustrated, a back gate contact B is coupled to the channel region 15 through the insulator layer 20, which forms a back gate (may also known as body contact although it is capacitively coupled to the channel region 15). Consequently, the threshold voltage of the transistor can be modulated by changing the potential applied through the back gate contact B.

In various embodiments of the present invention, a programmable digital signal is applied to a back gate of a silicon on insulator (SOI) transistor device to get a programmable hysteresis. In bulk transistor technologies, the body of the transistor cannot be biased to be more than the threshold voltage of the diode. Otherwise large diode leakage current will flow through the transistor. Therefore, only an analog signal less than the diode voltage can be applied on a back contact of a bulk transistor.

In contrast, in the case of a SOI transistor, the channel region 15 is separated from the back gate contact by an insulating layer, which behaves like a back gate. Therefore, a full digital signal can be applied without any secondary issues. As the back gate dielectric is thicker than the front gate dielectric, the potential applied at the back gate contact modulates the potential at the channel region 15. Consequently, this manifests as a change in threshold voltage of the transistor as the potential applied at the back gate contact B adds/subtracts to the potential from the gate contact G.

Accordingly, in various embodiments, a full digital signal (e.g., that toggles between VDD and 0V) can be applied on the back gate contact of the FDSOI transistor. Applying a back gate voltage effectively modulates the threshold voltage (Vt) of the FDSOI transistor. Therefore, transistors with different threshold voltages may be designed by correspondingly applying a back gate bias.

Accordingly, in various embodiments, the back gates of a differential transistor pair are biased differently so as to generate a Vt mismatch in the transistor pair. For example, in one example embodiment, one transistor of a differential transistor pair may be biased to VDD while the other transistor of a differential transistor pair may be biased to 0V at the same time.

Figure 3:
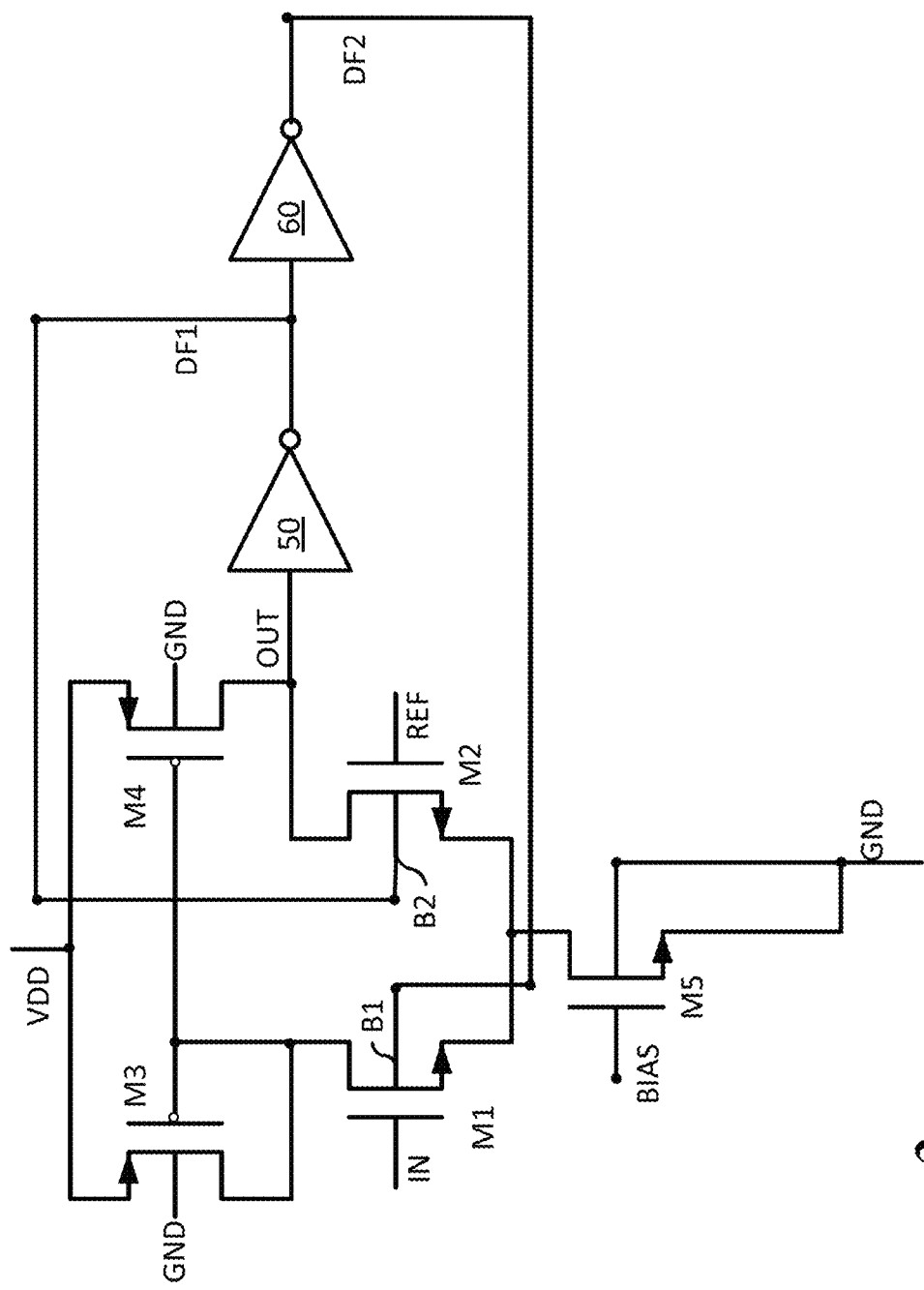
FIG. 3 illustrates a comparator comprising a single stage CMOS Op Amp receiving feedback at the back gate of the differential pair transistors in accordance with an embodiment of the present invention.

FIG. 3 illustrates a comparator comprising a single stage CMOS op amp in accordance with an embodiment of the present invention.

FIG. 3 illustrates a CMOS differential amplifier designed in SOI technology. The comparator comprises several elements, including a current mirror load which is coupled to a power supply, differential transistor pairs, inverter stages, and others.

As an illustration, in FIG. 3, the comparator comprises a first SOI transistor M1 and a second SOI transistor M2 forming a differential transistor pair. The differential transistor pair may be unbalanced (mismatched Vt) so as to generate the hysteresis. The first and the second SOI transistors M1 and M2 may be FDSOI transistors in various embodiments. The current mirror comprising the third transistor M3 and the fourth transistor M4 is coupled to the power rail such as VDD while the fifth transistor M5 is coupled to ground. The differential amplifier converts the differential input voltage to differential currents. These differential currents are applied to the current mirror load comprising the third transistor M3 and the fourth transistor M4 resulting in a single-ended output voltage.

In one embodiment, the first SOI transistor M1 and the second SOI transistor M2 forming the differential pair may be NMOS transistors because of the higher mobility of these devices. The current mirror may be designed using PMOS transistors as an example. The fifth transistor M5 is the bias transistor and controls the total current through the differential transistor pair.

Referring to FIG. 3, the input voltage (IN) is received at the gate contact of the first transistor M1 and a reference voltage (REF) is received at the gate contact of the second transistor M2.

The output of the comparator (OUT) is input into a first inverter 50 and a first feedback loop is coupled back to the back gate contact B2 of the second SOI transistor M2. A second inverter 60 is coupled to the output of the first inverter 50 and a second feedback loop is coupled back to the back gate contact B1 of the first transistor M1. Thus, a first digital feedback DF1 and a second digital feedback DF2 are applied to the back gates of the differential transistor pair.

As the first and the second digital feedbacks DF1 and DF2 are the input and output of the second inverter 60, the first digital feedback DF1 is phase shifted relative to the second digital feedback DF2 by 180 degrees, i.e., opposite in phase. In one example, if the first digital feedback DF1 is at VDD, then the second digital feedback DF2 is at 0V and vice versa. Additionally, advantageously, the feedback signal is a digital signal, e.g., toggling between VDD and 0V, and the feedback circuitry is very simple.

Consequently, at any time, only one of the transistors has a back gate bias, which increases the Vt mismatch between the differential transistor pair. For example, the transistor threshold voltage is dynamically decreased for one of the transistor without changing the other. The increase in Vt mismatch increases the hysteresis of the comparator.

Figure 4:
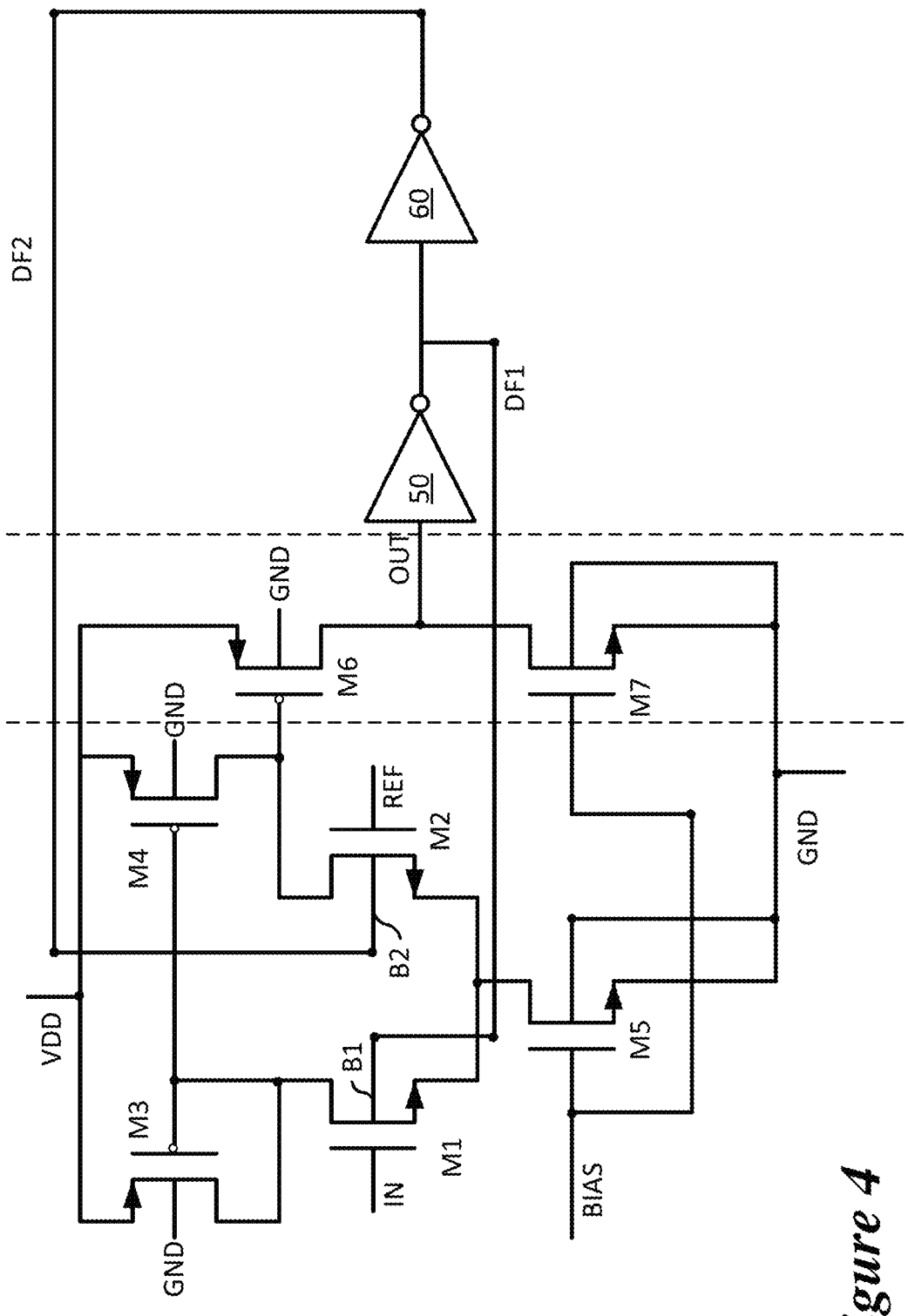
FIG. 4 illustrates a further embodiment of a two stage CMOS Op Amp comparator designed in SOI technology and comprising digital feedback to the back gate contact of the differential pair transistors.

FIG. 4 illustrates a further embodiment of a two stage CMOS Op Amp comparator designed in SOI technology and comprising digital feedback to the back gate contact of the differential pair transistors.

In another illustrative embodiment, a comparator may be a two stage CMOS Op Amp. A common-source amplifier is commonly used to increase the gain. A two stage CMOS op-amp acts as a comparator if there is no compensation. A simple two stage comparator is an op-amp without compensation. Comparators are generally used in open-loop mode and so it is not necessary to compensate the comparator. Since no compensation is needed, it has the largest bandwidth possible which gives a faster response.

Accordingly, a common source amplifier comprising a sixth transistor M6 and a seventh transistor M7 is coupled to the output of the differential amplifier of FIG. 3. In this example, the sixth transistor M6 is a PMOS and the seventh transistor M7 is a NMOS transistor.

The differential amplifier converts the differential input voltage to differential currents. These differential currents are applied to a current mirror load resulting in a single-ended output voltage. The first transistor M1 and the second transistor M2 form the differential pair with the third transistor M3 and the fourth transistor M4 form the active load. The second stage includes a common-source amplifier converting the second stage input voltage to a current. This transistor is loaded by a current-sink load, which converts the current to a voltage at the output node. The fifth transistor M5 provides the bias current for the differential pair.

This embodiment is similar to FIG. 3 and similarly includes a first digital feedback DF1 to the first transistor M1 and a second digital feedback DF2 to the second transistor M2.

Because of the additional inverter stage compared to the prior embodiment, the first feedback loop is coupled back to the back gate contact B1 of the first SOI transistor M1 and the second feedback loop is coupled back to the back gate contact B2 of the second transistor M2. Thus, a first digital feedback DF1 and a second digital feedback DF2 are applied to the back gates of the differential transistor pair.

In alternative embodiments, the comparator design may be changed suitably to optimize for other parameters. For example, in different architectures, the comparators may be designed as a folded cascaded comparator, clamped CMOS voltage comparator, and others.

Figure 5:
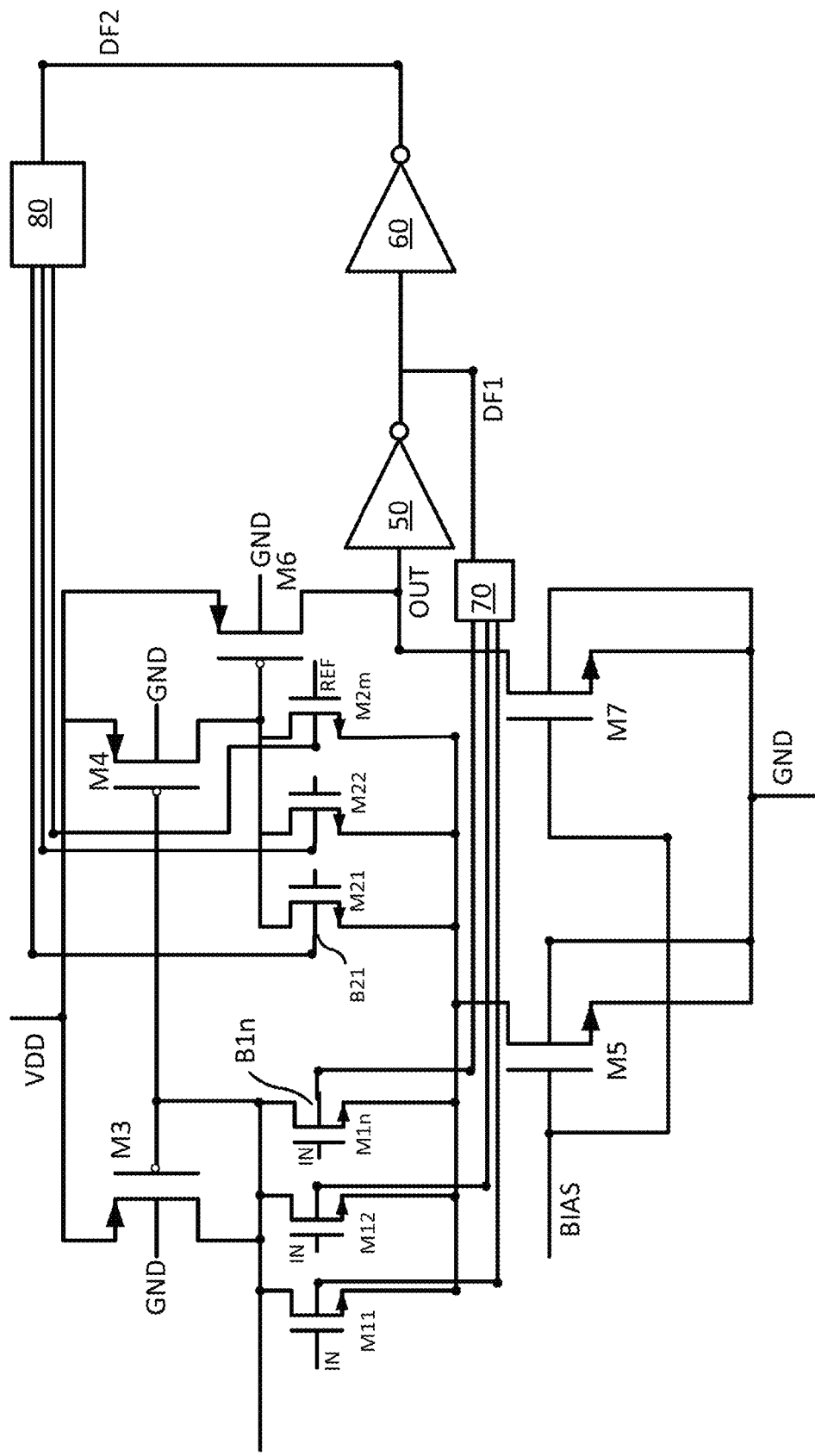
FIG. 5 illustrates a comparator receiving feedback through programmable switches in accordance with an embodiment of the present invention.

FIG. 5 illustrates a two stage comparator including a differential amplifier in accordance with an embodiment of the present invention.

In one or more embodiments, the comparator may be designed to enable dynamic programming of the hysteresis. For example, the hysteresis voltage $V_{HYS}$ may be controlled dynamically depending on the noise environment. The hysteresis may be programmed internally on chip in such embodiments. Advantageously, the programming of the hysteresis is performed using a digital circuit.

In one illustrative embodiment, where a larger hysteresis is needed, a larger Vt mismatch is generated at the differential transistor pair while when a smaller hysteresis is needed, a smaller Vt mismatch is generated at the differential transistor pair. Increase in Vt mismatch at the differential transistor pair increases the hysteresis.

In various embodiments, a plurality of differential pairs may be designed. For example, a single differential pair may be converted into a plurality of differential pairs. As illustrated in FIG. 5, the plurality of differential SOI transistors are made of transistor pairs {M11, M21}, {M12, M22}, . . . {M1n, M2n}.

Each transistor of the plurality of differential pairs is selected through a first programmable switch 70 or a second programmable switch 80. The mismatch between each differential pair may be controlled individually so that the total mismatch of the differential pair is effectively varied. In various embodiments, when more mismatch is needed, more pairs are provided feedback by controlling the programmable switches. On the other hand, when less mismatch is needed, less number of pairs are biased. Accordingly, the mismatch may be varied digitally. As one example, only the first differential pair is selected so that only {M11, M21} receive the first and the second digital feedbacks DF1 and DF2 while the remaining pairs {M12, M22}, . . . {M1n, M2n} are coupled to ground. Thus, in this above illustration, the back gate contact of SOI transistors {M11, M21} toggle between VDD and 0V. In contrast, if a large mismatch is desired all the pairs {M11, M21}, {M12, M22}, . . . {M1n, M2n} receive the first and the second digital feedbacks DF1 and DF2.

Figure 6:
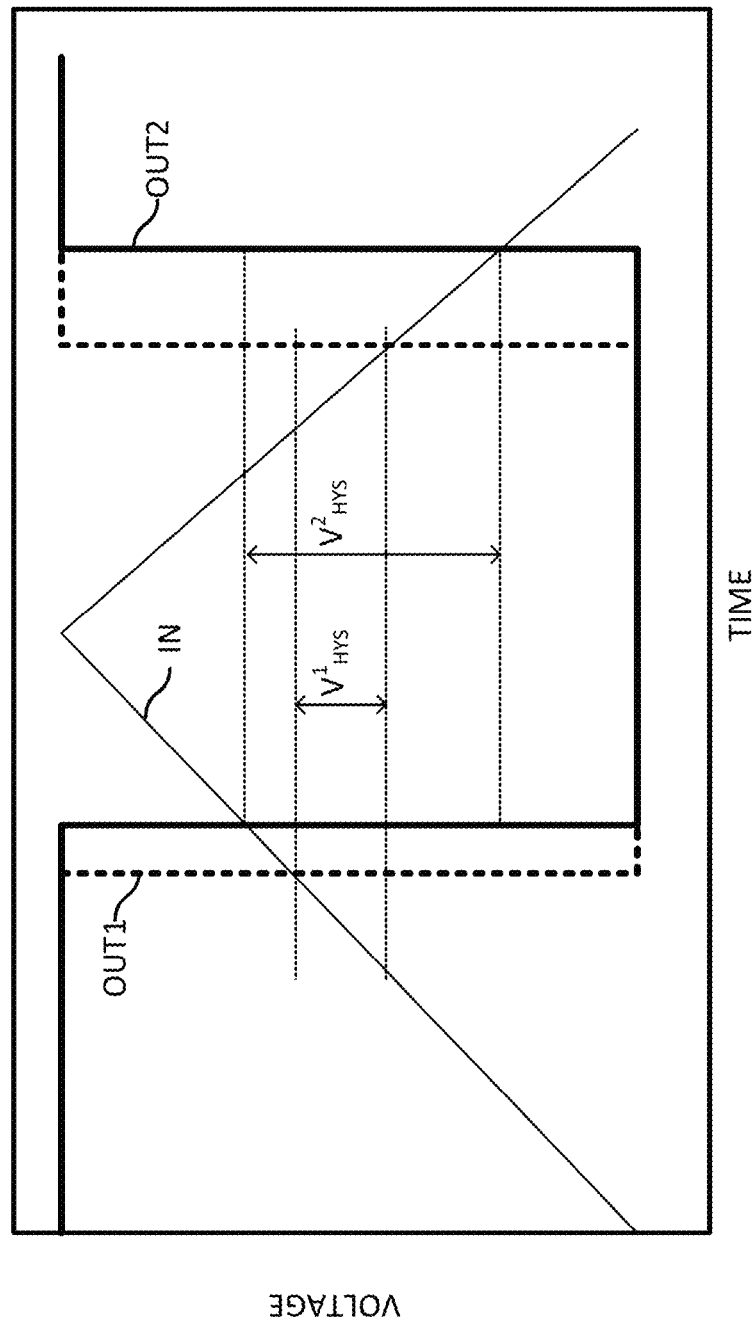
FIG. 6 illustrates a schematic input/output voltage characteristic of the programmable comparator in accordance with embodiments of the present invention.

FIG. 6 illustrates a schematic programming ability of the comparator in accordance with embodiments of the present invention.

As described previously, hysteresis is the difference between the rising threshold and the falling threshold. When Vt mismatch is increasing, trip voltage on the rising edge is lower but higher on the falling edge. Therefore, the effective hysteresis is different when a back gate bias is introduced.

Referring to FIG. 6, when a first set of differential pairs are selected a first hysteresis ($V^1_{HYS}$) is obtained. In the first case, only a select few differential pairs have feedback. In such a case, the rising edge is lower and the falling edge is higher. In contrast, when a different set of differential pairs are selected a second hysteresis ($V^2_{HYS}$) is obtained. The second hysteresis ($V^2_{HYS}$) is greater than the first hysteresis ($V^1_{HYS}$).

Figure 7:
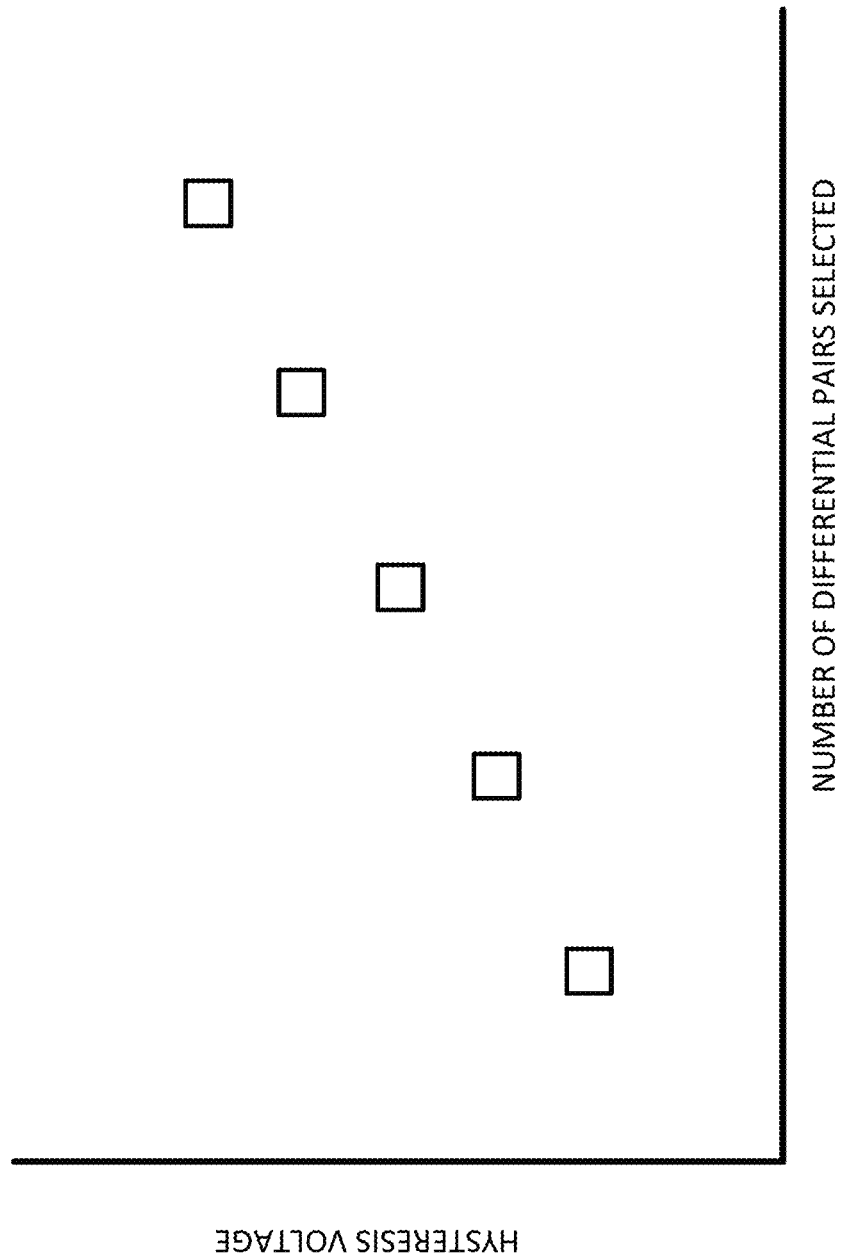
FIG. 7 illustrates a schematic of the programmability of the comparator by selectively providing feedback in accordance with embodiments of the present invention.

FIG. 7 illustrates a schematic of adjusting the hysteresis characteristic of the programmable comparator in accordance with embodiments of the present invention.

Referring to FIG. 7, the hysteresis voltage ($V_{HYS}$) may be controlled by dynamically changing the number of differential transistor pairs that are being selected to receive the digital feedback.

Figure 8:
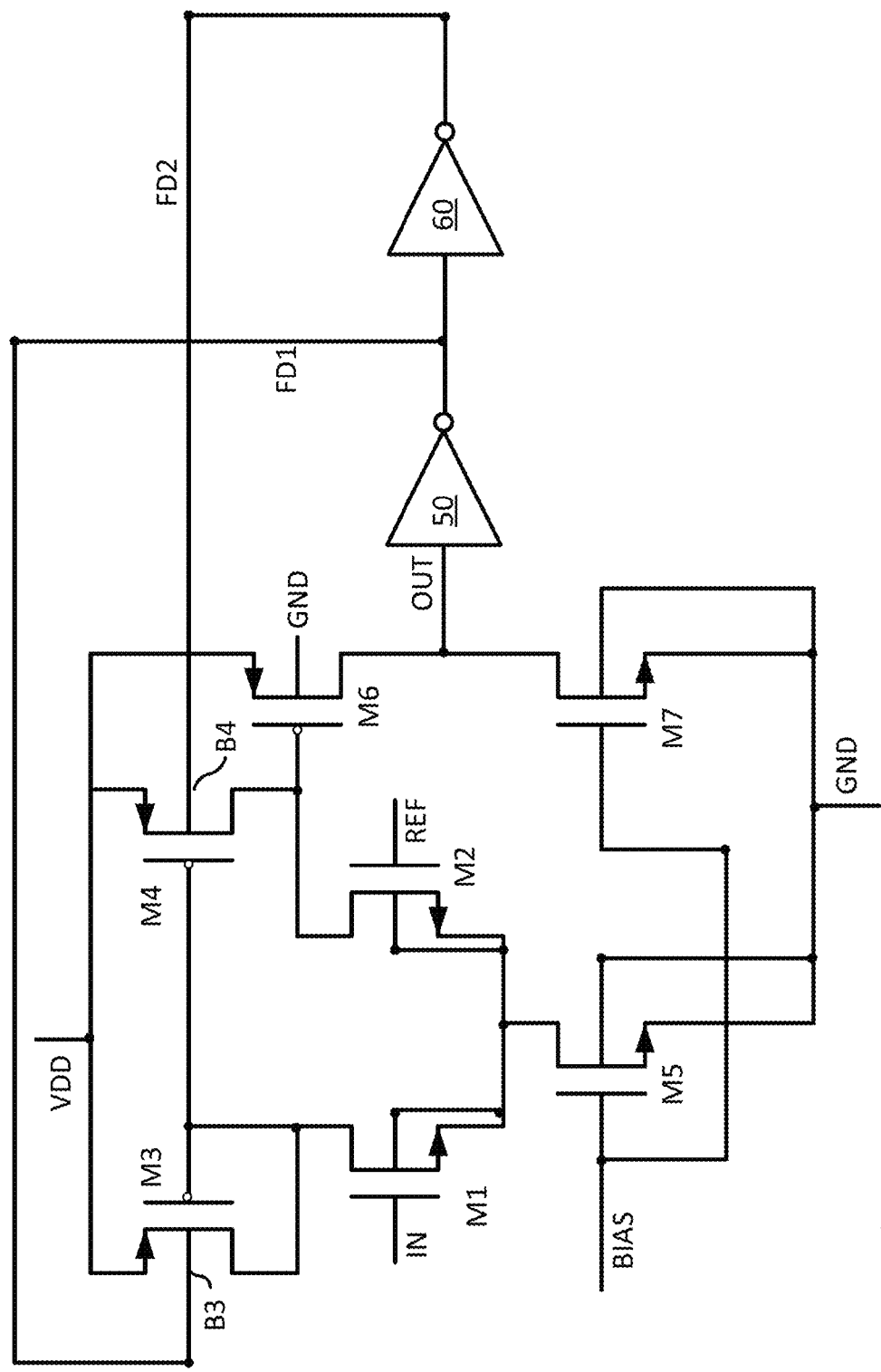
FIG. 8 illustrates a two stage comparator having digital feedback provided to a current mirror in accordance with an embodiment of the present invention.

FIG. 8 illustrates a two stage comparator having digital feedback provided to the current mirror in accordance with an embodiment of the present invention.

In an alternative embodiment, the back gate contact of the current mirror transistors may be adjusted instead of adjusting the back gate contact of the differential transistor pair. In this embodiment, a first digital feedback DF1 is provided to a back gate contact B3 of a third transistor M3 and a second digital feedback DF2 is provided to a back gate contact B4 of a fourth transistor M4.

The current mirror is an important component in MOS amplifiers. The current mirror uses the principle that if the gate-source potential of two identical MOS transistors are equal, the channel currents should be equal.

A current $I_{D13}$ flows through the third transistor M3 corresponding to a gate to source voltage $V_{GS3}$. Since $V_{GS3}=V_{GS24}$, ideally the same current flows through the third and the fourth transistors M3 and M4. If the MOSFET's are of the same size, the same drain current flows in each MOSFET provided the fourth transistor M4 stays in the saturation region.

The current $I_{D3}$ may be approximated as $I_{D3}=\beta_3(V_{GS3}-V_{T3})^n$. While the output current $I_{D4}$, assuming the fourth transistor M4 is in saturation, flowing in the fourth transistor M4 is given as $I_{D4}=\beta_4(V_{GS4}-V_{T4})_n$.

However, the bias on the back gate of the transistor effective changes the threshold voltage of the transistor. Accordingly, a mismatch may be introduced between the current $I_{D3}$ flowing through the third transistor M3 and the current $I_{D4}$ flowing through the fourth transistor M4. Accordingly, in various embodiments, a desired output current can be achieved by adjusting the back gate potential mismatch using the back gate feedback loop.

This embodiment may be combined with the embodiment described in FIG. 5 so that the current mirror circuit is divided into multiple fingers whose feedback is dynamically controlled separately. In a further alternative embodiment, the back gate contact of the current mirror transistors and the differential transistor pair may be provided with digital feedback signals.

Although in FD-SOI, two flavors of PMOS transistors are possible, a low threshold voltage (LVT) design and a regular threshold voltage (RVT) design. Although the LVT device can only take an increase in threshold voltage, the embodiment described in FIG. 8 is applicable to either design.

Figure 9:
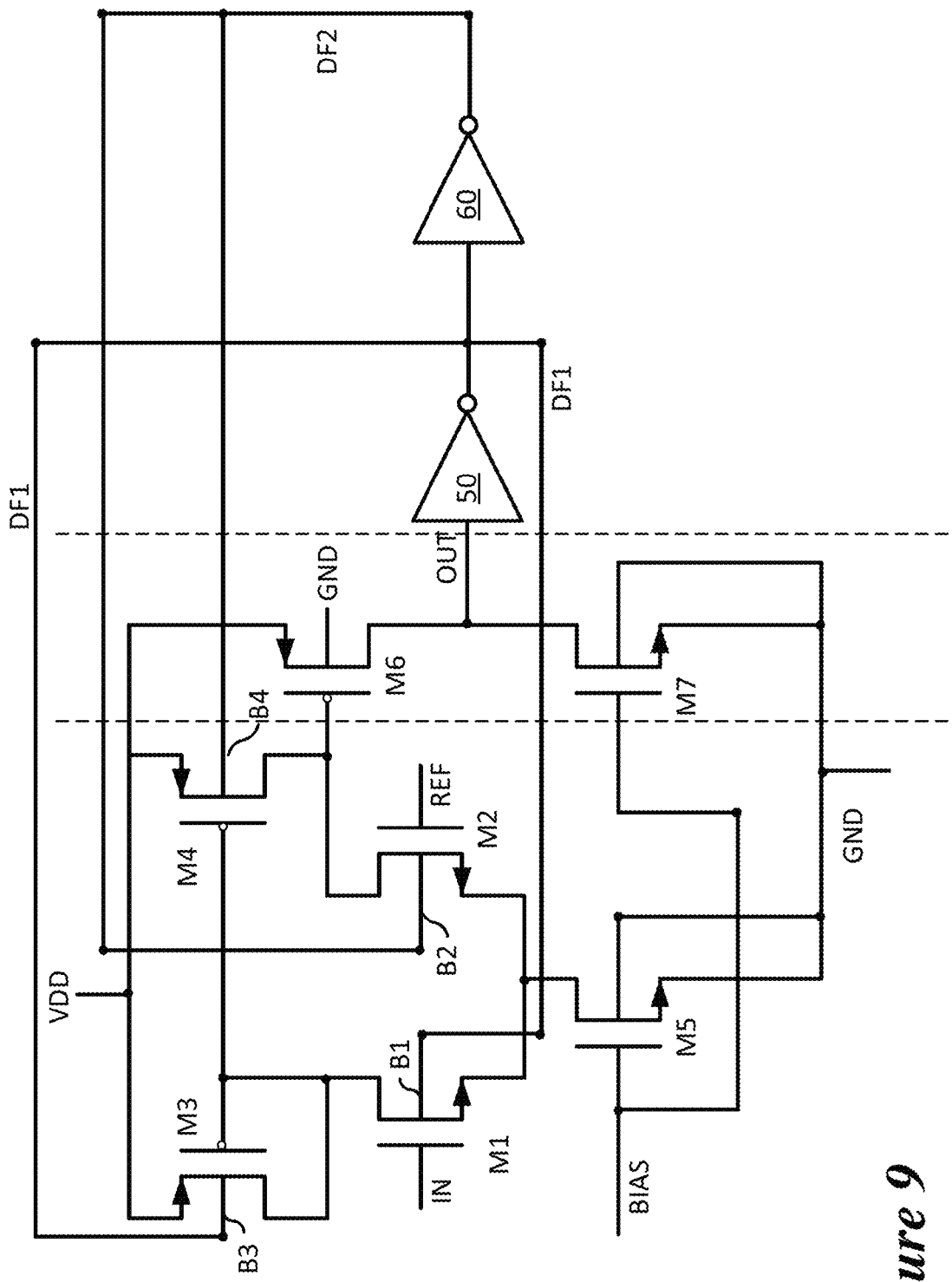
FIG. 9 illustrates a two stage comparator having digital feedback provided to the current mirror in accordance with an embodiment of the present invention.

FIG. 9 illustrates a two stage comparator having digital feedback provided to the current mirror in accordance with an embodiment of the present invention.

In a further embodiment, both the current mirror and the differential pair may be provided with a digital feedback. For example, the embodiments described in FIGS. 4 and 8 are combined in this illustration. When the current mirror and the differential pairs comprise different types of transistors, the digital feedback may be appropriately adjusted. For example, the first feedback loop DF1 is provided to the back gate B1 of the first transistor M1 and the back gate B3 of the third transistor M3 while the second feedback loop DF2 is provided to the back gate B2 of the second transistor M2 and the back gate B4 of the fourth transistor M4.

Figure 10:
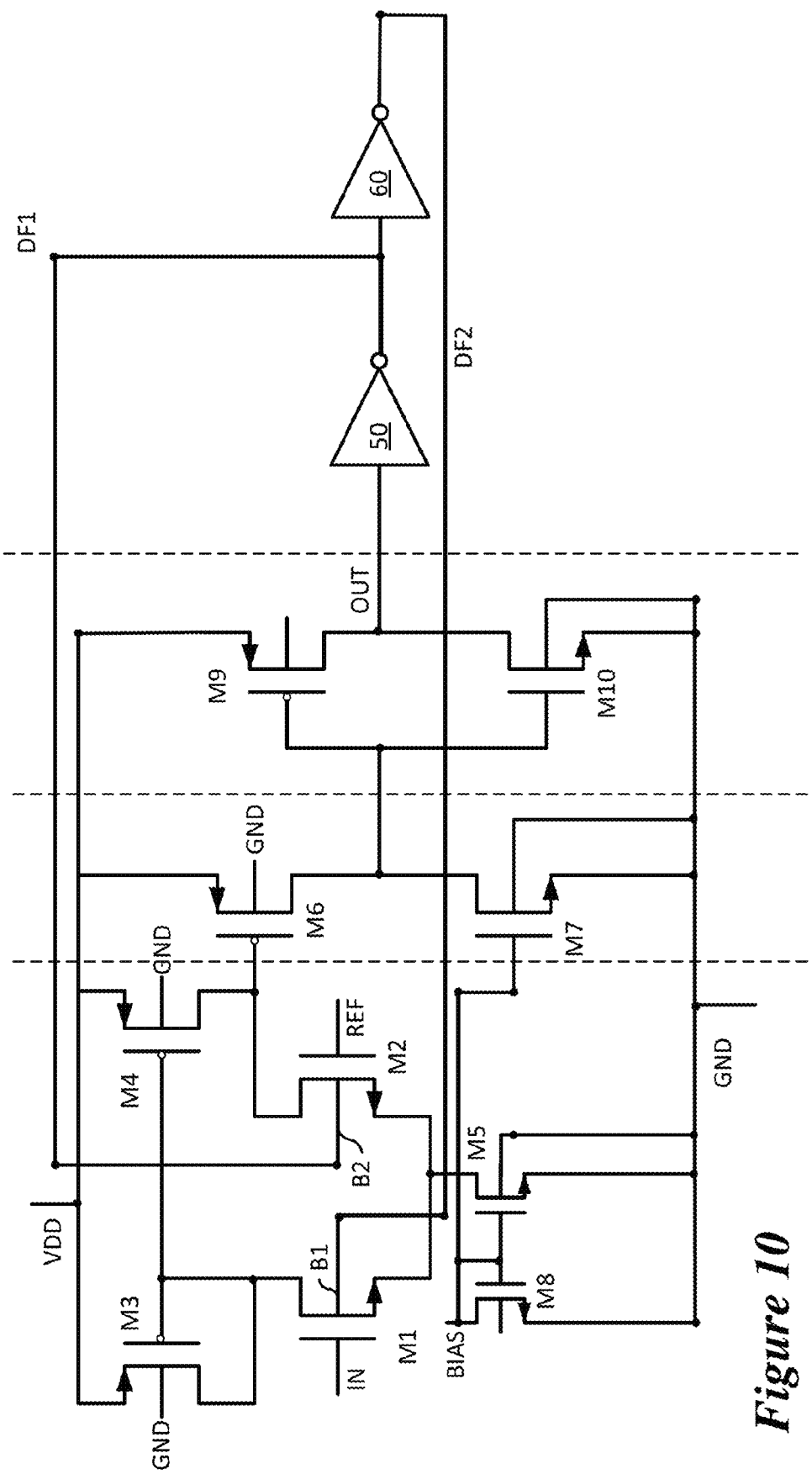
FIG. 10 illustrates a schematic of a three stage comparator incorporating digital feedback in accordance with embodiments of the present invention.

FIG. 10 illustrates a schematic of a three stage comparator incorporating digital body feedback in accordance with embodiments of the present invention.

The current mirror formed by fifth and eight transistors M5 and M8 supplies the differential pair comprising the first and the second transistors M1 and M2 with bias current. The input differential pair is actively loaded with the current mirror formed by the third and the fourth transistors M3 and M4. The second stage which is a common source amplifier is actively loaded with the sixth transistor M6. The common source amplifier improves the gain of the amplifier. The third stage which consists of the inverter comprising the ninth and tenth transistor M9 and M10 is used to increase the gain modestly and to improve the slew-rate at the output node OUT.

As described in previous embodiments, because of the additional inverter stage, the first digital feedback DF1 is coupled to the back gate contact of the second transistor M2 and a second digital feedback DF2 is coupled to the back gate contact of the first transistor M1.

Accordingly, advantageously, in various embodiments, the comparator is tuned dynamically as per noise requirements. Thus, in various embodiments, if expecting less noise, the hysteresis may be adjusted to be lower and vice versa. By changing the amount of Vt mismatch, different switching points are obtained.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 3-10 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

What is claimed is:

1. A circuit comprising:
 a differential amplifier comprising a differential pair comprising a first transistor and second transistor, each of the first and the second transistors comprising a front gate contact and a back gate contact;
 an inverting circuit having an input and an output, wherein the input of the inverting circuit is coupled to an output of the differential amplifier;
 a first node between the input of the inverting circuit and the output of the differential amplifier;
 a second node coupled to the output of the inverting circuit;
 a first digital feedback loop coupled between the first node and the back gate contact of the first transistor; and
 a second digital feedback loop coupled between the second node and the back gate contact of the second transistor, wherein the first digital feedback loop is configured to be opposite in phase to the second digital feedback loop.

2. The circuit of claim 1, wherein the circuit is a comparator.

3. The circuit of claim 2, wherein the comparator is one of a CMOS op amp, a folded cascoded comparator, clamped voltage comparator.

4. The circuit of claim 1, further comprising:
 a common source amplifier coupled to the output of the differential amplifier.

5. The circuit of claim 1, further comprising:
 a common source amplifier coupled to the output of the differential amplifier; and
 an inverter coupled to the output of the common source amplifier.

6. The circuit of claim 1, wherein the differential pair is unbalanced.

7. The circuit of claim 1, further comprising:
 a current mirror load coupled to the differential pair, the current mirror comprising a third transistor and a fourth transistor, each of the third and the fourth transistors comprising a front gate contact and a back gate contact;
 a third digital feedback loop coupled to the back gate contact of the third transistor; and
 a fourth digital feedback loop coupled to the back gate contact of the fourth transistor, wherein the third digital feedback loop is configured to be opposite in phase to the fourth digital feedback loop.

8. The circuit of claim 7, wherein the third transistor is coupled to the first transistor and the fourth transistor is coupled to the second transistor, wherein the third digital feedback loop and the first digital feedback loop are configured to provide the same feedback signal, and wherein the fourth digital feedback loop and the second digital feedback are configured to provide the same feedback signal.

9. A circuit comprising:
 a current mirror comprising a first transistor and second transistor, each of the first and the second transistors comprising a front gate contact and a back gate contact, wherein the front gate contact of the first transistor is coupled to the front gate contact of the second transistor;
 a first digital feedback loop coupled to the back gate contact of the first transistor; and
 a second digital feedback loop coupled to the back gate contact of the second transistor, wherein the first digital feedback loop is configured to be opposite in phase to the second digital feedback loop.

10. The circuit of claim 9, further comprising a differential transistor pair coupled to the current mirror.

11. The circuit of claim 9, wherein the circuit is a comparator.

12. The circuit of claim 11, wherein the comparator is one of a CMOS op amp, a folded cascoded comparator, clamped voltage comparator.

13. A comparator comprising:
 a differential amplifier including a differential transistor pair comprising a first transistor and a second transistor, wherein each of the first and the second transistors comprise a four terminal silicon on insulator transistor comprising a back gate contact;
 a first inverter coupled to an output of the differential amplifier;
 a first feedback loop coupled between an output of the first inverter and the back gate contact of the first transistor;
 a second inverter coupled to the output of the first inverter; and
 a second feedback loop coupled between the output of the second inverter and the back gate contact of the second transistor.

14. The comparator of claim 13, further comprising a common source amplifier coupled to the output of the differential amplifier, wherein the first inverter is coupled to an output of the common source amplifier.

15. The comparator of claim 13, further comprising:
 a common source amplifier coupled to an output of the differential amplifier; and
 a third inverter coupled to an output of the common source amplifier, wherein the first inverter is coupled to an output of the third inverter.

16. The comparator of claim 13, further comprising a current mirror coupled to the differential transistor pair.

17. The comparator of claim 13, wherein the four terminal silicon on insulator transistor of the differential transistor pair is a fully depleted silicon on insulator transistor.

18. A comparator comprising:
 a differential amplifier including a current mirror comprising a first transistor and a second transistor, wherein each of the first and the second transistors comprise a four terminal silicon on insulator transistor comprising a back gate contact;
 a first inverter coupled to an output of the differential amplifier;
 a first feedback loop coupled between an output of the first inverter and the back gate contact of the first transistor;
 a second inverter coupled to the output of the first inverter; and
 a second feedback loop coupled between an output of the second inverter and the back gate contact of the second transistor.

19. The comparator of claim 18, further comprising a common source amplifier coupled to the output of the differential amplifier, wherein the first inverter is coupled to the output of an common source amplifier.

20. The comparator of claim 18, further comprising:
 a common source amplifier coupled to the output of the differential amplifier; and
 a third inverter coupled to an output of the common source amplifier, wherein the first inverter is coupled to an output of the third inverter.

21. A method of operating a comparator circuit, the method comprising:
 providing a transistor pair comprising a first transistor and a second transistor, wherein the first and the second transistors comprise a four terminal comprising a front gate contact and a back gate contact;

generating a first digital feedback signal from an output of the transistor pair;

generating a second digital feedback signal by inverting the first feedback signal; and changing a hysteresis of the comparator circuit by applying the first digital feedback signal on the back gate contact of the first transistor and the second digital feedback signal on the back gate contact of the second transistor, wherein the first feedback signal is opposite in phase to the second feedback signal.

22. The method of claim 21, wherein the transistor pair is a silicon on insulator technology.

23. The method of claim 21, wherein the transistor pair is a fully depleted silicon on insulator technology.

24. The method of claim 21, wherein the transistor pair is a differential transistor pair.

25. The method of claim 21, wherein the transistor pair is a current mirror.

26. The circuit of claim 1, wherein the inverting circuit is an inverter.

27. The comparator of claim 13, further comprising:
   a first programmable switch between the output of the first inverter and the back gate contact of the first transistor, the first programmable switch configured to apply the first feedback loop at the back gate contact of the first transistor; and
   a second programmable switch coupled between the output of the second inverter and the back gate contact of the second transistor, the second programmable switch configured to apply the second feedback loop at the back gate contact of the second transistor.

28. The comparator of claim 27, wherein the differential amplifier includes another differential transistor pair comprising a third transistor and a fourth transistor, wherein each of the third and the fourth transistors comprise a four terminal silicon on insulator transistor comprising a back gate contact;
   a third feedback loop coupled between the output of the first inverter and the back gate contact of the third transistor, wherein the third feedback loop comprises the same signal as the first feedback loop; and
   a fourth feedback loop coupled between the output of the second inverter and the back gate contact of the fourth transistor, wherein the fourth feedback loop comprises the same signal as the second feedback loop.

29. The comparator of claim 28, wherein the first programmable switch is configured to apply the third feedback loop at the back gate contact of the third transistor, wherein the second programmable switch is configured to apply the fourth feedback loop at the back gate contact of the fourth transistor.

30. The comparator of claim 18, further comprising:
   a first programmable switch between the output of the first inverter and the back gate contact of the first transistor, the first programmable switch configured to apply the first feedback loop at the back gate contact of the first transistor; and
   a second programmable switch coupled between the output of the second inverter and the back gate contact of the second transistor, the second programmable switch configured to apply the second feedback loop at the back gate contact of the second transistor.

31. The comparator of claim 30, wherein the differential amplifier includes another differential transistor pair comprising a third transistor and a fourth transistor, wherein each of the third and the fourth transistors comprise a four terminal silicon on insulator transistor comprising a back gate contact;
   a third feedback loop coupled between the output of the first inverter and the back gate contact of the third transistor, wherein the third feedback loop comprises the same signal as the first feedback loop; and
   a fourth feedback loop coupled between the output of the second inverter and the back gate contact of the fourth transistor, wherein the fourth feedback loop comprises the same signal as the second feedback loop.

32. The comparator of claim 31, wherein the first programmable switch is configured to apply the third feedback loop at the back gate contact of the third transistor, wherein the second programmable switch is configured to apply the fourth feedback loop at the back gate contact of the fourth transistor.

* * * * *